United States Patent
Kawano

(10) Patent No.: US 7,605,434 B2
(45) Date of Patent: Oct. 20, 2009

(54) SEMICONDUCTOR MEMORY DEVICE TO WHICH TEST DATA IS WRITTEN

(75) Inventor: Tomohito Kawano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 11/739,381

(22) Filed: Apr. 24, 2007

(65) Prior Publication Data

US 2007/0266279 A1    Nov. 15, 2007

(30) Foreign Application Priority Data

Apr. 25, 2006 (JP) ............................. 2006-120945

(51) Int. Cl.
*G11C 29/00* (2006.01)
(52) U.S. Cl. .................. 257/390; 257/393; 257/208; 257/48; 257/E21.662; 365/201; 365/185.13; 365/185.11; 365/230.03
(58) Field of Classification Search ................. 257/390, 257/393, 208, 48, E21.662; 365/201, 185.13, 365/185.11, 230.03
See application file for complete search history.

(56) References Cited

U.S. PATENT DOCUMENTS

| | | | |
|---|---|---|---|
| 6,182,262 B1 | 1/2001 | Seyyedy | |
| 6,262,928 B1 | 7/2001 | Kim et al. | |
| 6,603,683 B2 * | 8/2003 | Hsu et al. | 365/189.04 |
| 6,754,116 B2 | 6/2004 | Janik et al. | |
| 7,319,631 B2 * | 1/2008 | Cho | 365/230.03 |
| 7,333,387 B2 * | 2/2008 | Hwang | 365/230.03 |
| 7,369,444 B2 * | 5/2008 | Perego et al. | 365/189.011 |
| 2003/0218217 A1 * | 11/2003 | Saito | 257/390 |

FOREIGN PATENT DOCUMENTS

JP            2001-236795           8/2001

* cited by examiner

*Primary Examiner*—Eugene Lee
(74) *Attorney, Agent, or Firm*—Oblon, Spivak, McClelland, Maier & Neustadt, L.L.P.

(57) ABSTRACT

A semiconductor memory device of this invention includes a first bank, a second bank, and a bank decoder that selects a bank to be activated from the first and second banks. When testing operations of first memory cells and second memory cells, the bank decoder simultaneously selects the first and second banks, and first and second write load circuits simultaneously write data in memory cells in first and second blocks, respectively.

16 Claims, 18 Drawing Sheets

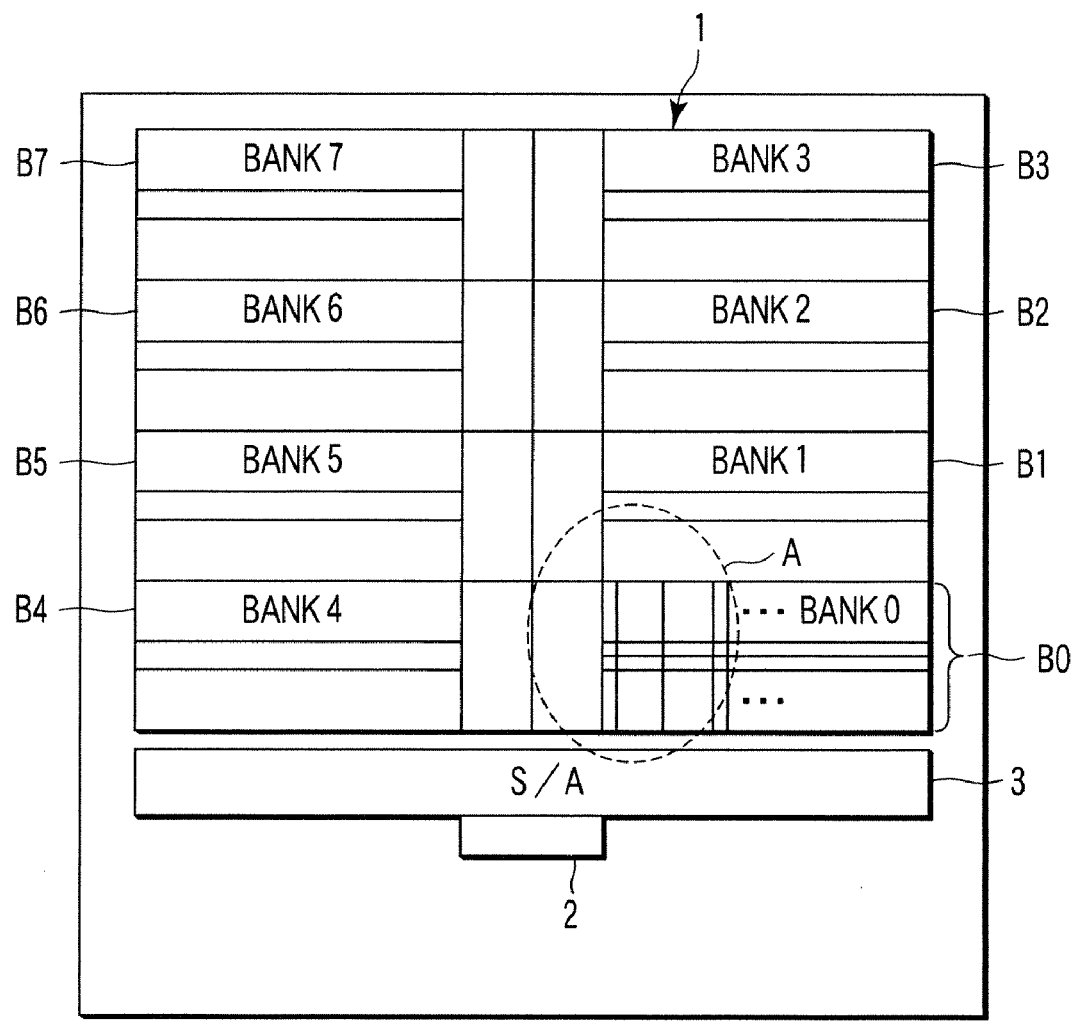
F I G. 1

SEMICONDUCTOR MEMORY DEVICE TO WHICH TEST DATA IS WRITTEN

CROSS-REFERENCE TO RELATED APPLICATIONS

This application is based upon and claims the benefit of priority from prior Japanese Patent Application No. 2006-120945, filed Apr. 25, 2006, the entire contents of which are incorporated herein by reference.

BACKGROUND OF THE INVENTION

1. Field of the Invention

The present invention relates to a semiconductor memory device, e.g., a NOR type nonvolatile semiconductor memory device.

2. Description of the Related Art

In a semiconductor memory device in which bit lines having even numbers (even-numbered bit lines) and bit lines having odd numbers (odd-numbered bit lines) are separately allocated to input/output lines I/O, data write to memory cells is performed as follows. A write load circuit supplies a write voltage to a data line by selecting an upside or downside memory cell array by a switching transistor. This write voltage supplied to the data line charges a bit line selected by a column selection transistor. The charged bit line writes data in memory cells.

When writing a checker pattern in a memory cell array of the semiconductor memory device described above, the data is written by using an even-numbered bit line, e.g., a data line DL0, with respect to the nth one of word lines WL. That is, when the product has 16-bit input/output lines I/O, only 8 bits of low-order input/output lines I/O of the write load circuit are active, and 8 bits of high-order input/output lines I/O of the write load circuit are disabled.

As described above, the conventional semiconductor memory device writes the checker pattern by using only 8 bits of the low-order input/output lines I/O. This makes it impossible to reduce the write time required to write the checker pattern. Note that the checker pattern is a pattern in which data are alternately inverted between adjacent memory cells, and is test data that is written in a memory cell array at the time of testing and used to verify whether expected values are written.

Also, one prior art related to the present invention has proposed a semiconductor memory that comprises a first switching means for selecting odd-numbered or even-numbered word lines in accordance with a pattern signal in a test mode, and a second switching means for applying complementary data signals to the odd-numbered and even-numbered bit lines in accordance with the pattern signal, and writes the checker pattern in all memory cells by performing a write operation twice (Jpn. Pat. Appln. KOKAI Publication No. 2001-236795).

BRIEF SUMMARY OF THE INVENTION

A semiconductor memory device of the present invention according to the first aspect comprises a first bank, a second bank, and a bank decoder that selects a bank to be activated from the first and second banks.

The first bank includes a first block in which a plurality of first memory cells are arranged in a matrix; a plurality of first bit lines connected to the plurality of first memory cells; a first data line connected to even-numbered bit lines of the plurality of first bit lines via a column selection transistor, and a second data line connected to odd-numbered bit lines of the plurality of first bit lines via a column selection transistor; and a first write load circuit which applies a first write voltage corresponding to write data to the first data line and the second data line at the time of data write. The second bank includes a second block in which a plurality of second memory cells are arranged in a matrix; a plurality of second bit lines connected to the plurality of second memory cells; a third data line connected to even-numbered bit lines of the plurality of second bit lines via a column selection transistor, and a fourth data line connected to odd-numbered bit lines of the plurality of second bit lines via a column selection transistor; and a second write load circuit which applies a second write voltage corresponding to write data to the third data line and the fourth data line at the time of data write.

When testing operations of the first memory cells and the second memory cells, the bank decoder simultaneously selects the first and second banks, and the first and second write load circuits simultaneously write data in memory cells in the first and second blocks.

A semiconductor memory device of the present invention according to the second aspect comprises a first block in which a plurality of first memory cells are arranged in a matrix, the first block being formed in a bank; a plurality of first bit lines connected to the plurality of first memory cells in the first block; a second block in which a plurality of second memory cells are arranged in a matrix, the second block being formed in the bank; a plurality of second bit lines connected to the plurality of second memory cells in the second block; a first data line connected to even-numbered bit lines of the plurality of first bit lines and the plurality of second bit lines via a column selection transistor; a second data line connected to odd-numbered bit lines of the plurality of first bit lines and the plurality of second bit lines via a column selection transistor; a write load circuit which applies a write voltage corresponding to write data to the first data line and the second data line at the time of data write; and a block decoder which selects a block to be activated from the first block and the second block, wherein when testing operations of the plurality of memory cells, the block decoder simultaneously selects the first block and the second block, and the write load circuit simultaneously writes data in memory cells in the first block and memory cells in the second block.

BRIEF DESCRIPTION OF THE SEVERAL VIEWS OF THE DRAWING

FIG. 1 is a view showing the arrangement of a semiconductor memory device of a first embodiment of the present invention;

DETAILED DESCRIPTION OF THE INVENTION

Figure 2:
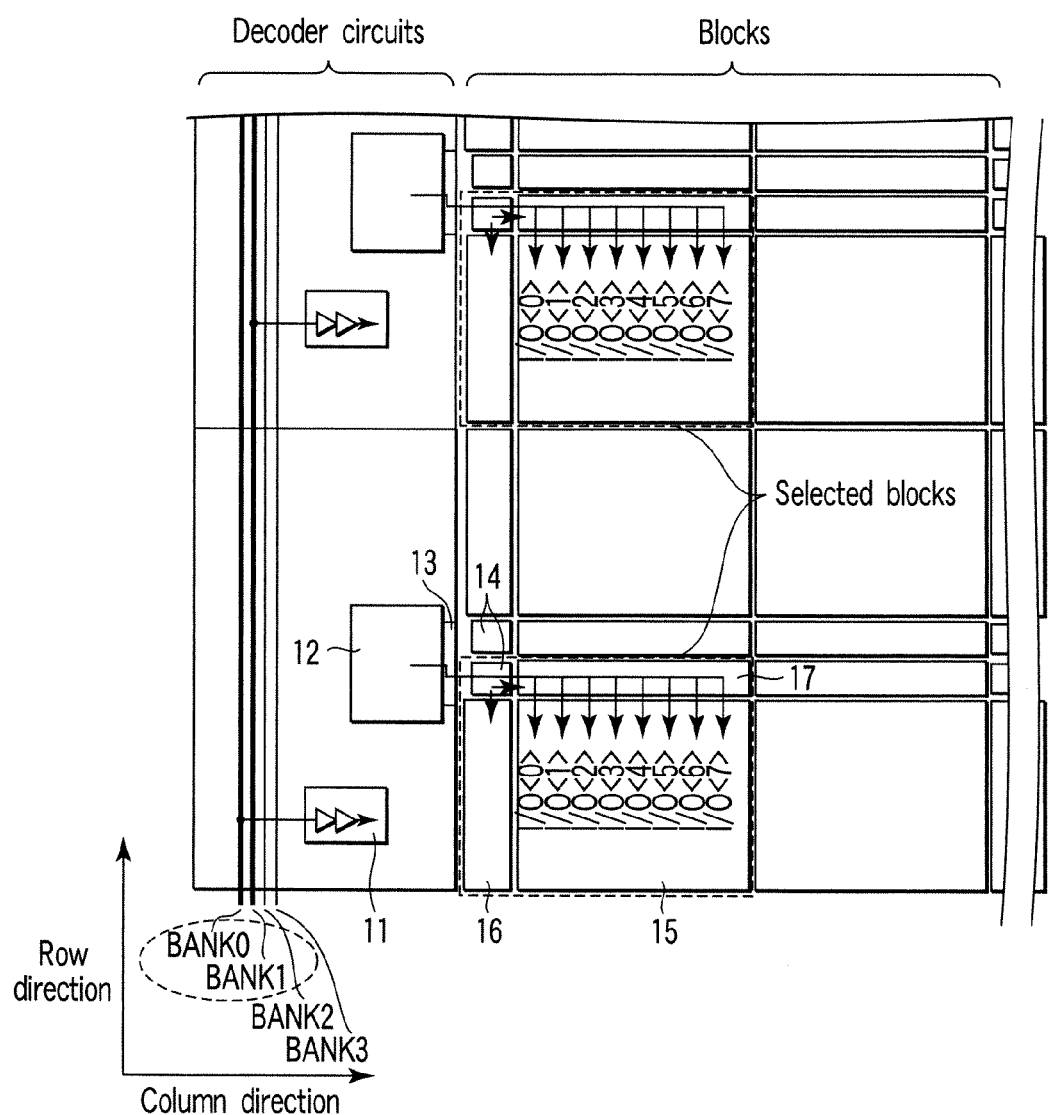
FIG. 2 is an enlarged view of a portion A indicated by the broken line in FIG. 1.

Embodiments of the present invention will be explained below with reference to the accompanying drawing. In the following explanation, the same reference numerals denote the same parts throughout the drawing.

First Embodiment

A semiconductor memory device of the first embodiment of the present invention will be explained below.

FIG. 1 is a view showing the arrangement of the semiconductor memory device of the first embodiment, and represents a chip image. This semiconductor memory device comprises a memory cell array 1 having eight banks B0 to B7, a bank decoder 2, and a sense amplifier (S/A) 3. The bank decoder 2 selects a bank to be activated from the banks B0 to B7 on the basis of a bank address. The sense amplifier 3 reads out data stored in a memory cell in the bank selected by the bank decoder 2. Although this embodiment will explain an example in which the memory cell array has eight banks, the number of banks is not limited to eight. The banks are minimum units for which data write or erase can be simultaneously performed in parallel in a normal operation.

FIG. 2 is an enlarged view of a portion A indicated by the broken line in FIG. 1, and shows details of the internal arrangement of the bank. The bank comprises decoder circuits and blocks. The decoder circuits include bank selectors 11, write load circuits 12, and switching circuits 13. The blocks include block selectors 14, blocks 15, row decoders 16, and column selection transistor units 17. Memory cells are arranged in a matrix in each block 15. The row decoder 16 selects a word line connected to memory cells in the block 15. The column selection transistor unit 17 selects a bit line connected to memory cells in the block 15. The bank selectors 11 select banks on the basis of bank selection signals BANK0, BANK1, BANK2, BANK3. In the selected bank, the decoder circuits are enabled to select the block 15, row decoder 16, and column selection transistor unit 17 in the bank. The block selector 14 is connected to the write load circuit 12. The write load circuit 12 supplies a write voltage to input/output lines I/O<0>, I/O<1>, I/O<2>, . . . , I/O<7> in the block 15 selected by the block selector 14. In this embodiment, the column direction is a direction in which bit lines are arranged, and the row direction is a direction in which word lines are arranged.

Figure 3:
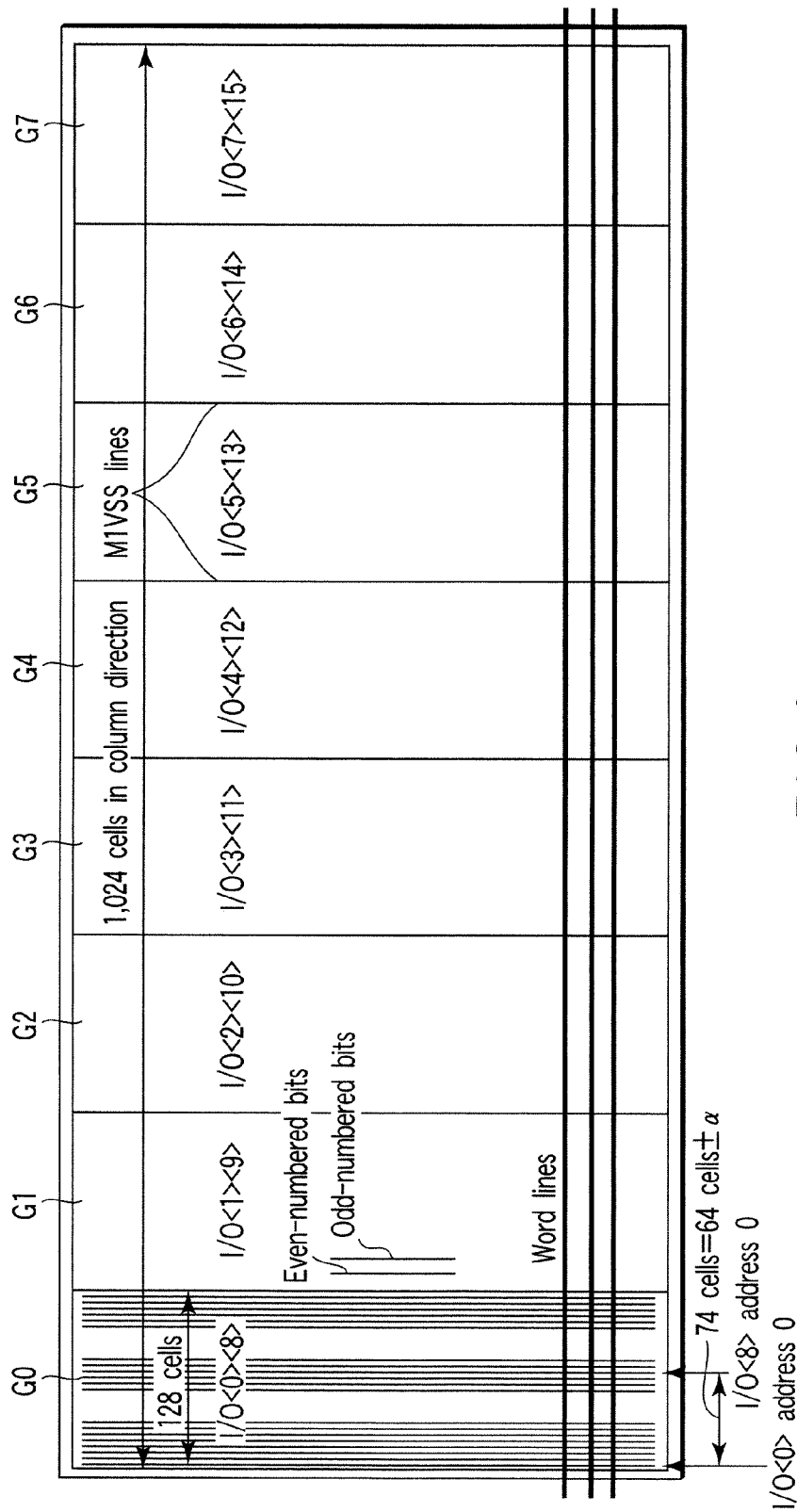
FIG. 3 is an enlarged view showing details of the arrangement of a block in a bank shown in FIG. 2.
Figure 4:
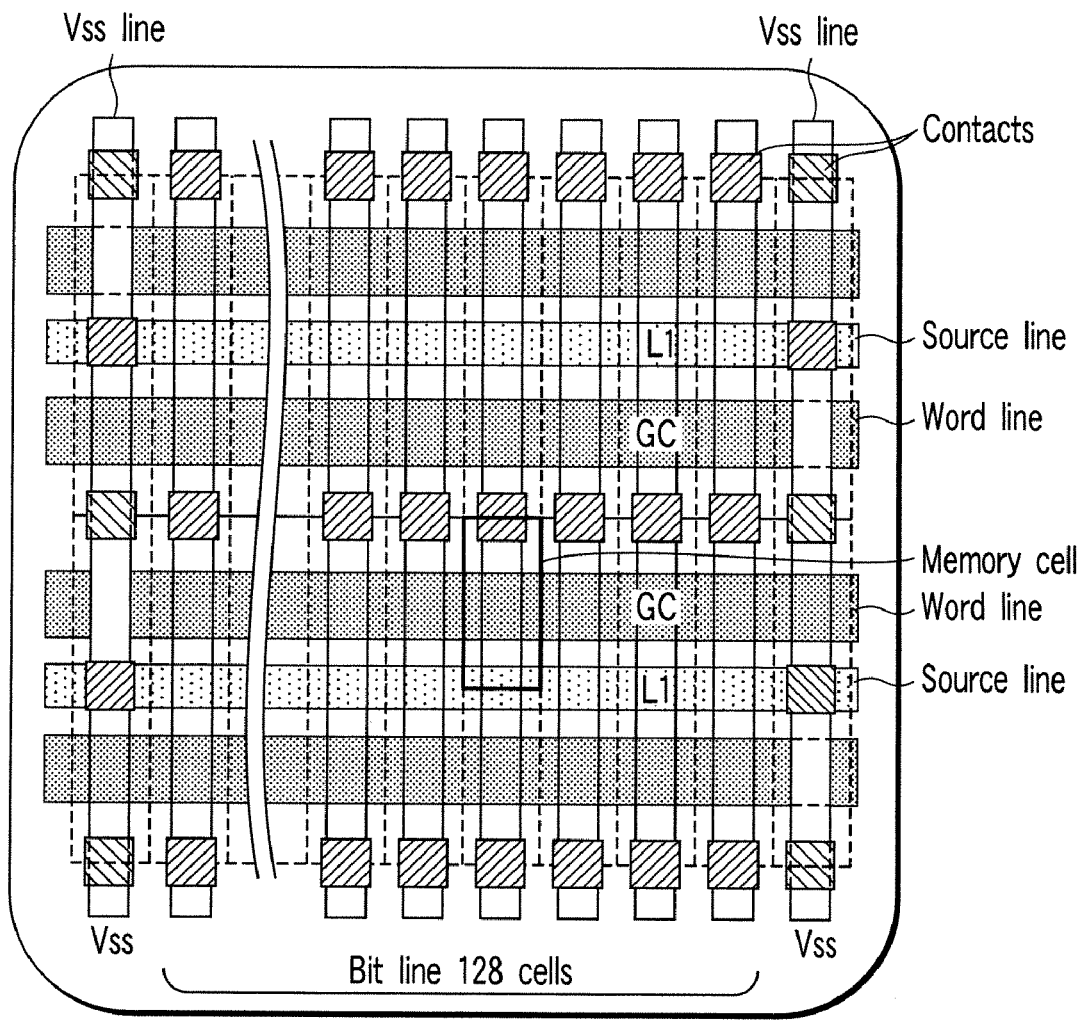
FIG. 4 is an enlarged view of a portion of a group in the block shown in FIG. 3.

FIG. 3 is an enlarged view showing details of the arrangement of the block 15 in the bank shown in FIG. 2. The block 15 is divided into eight groups G0 to G7, and two input/output lines I/O correspond to each group. For example, the input/output line I/O<0> and an input/output line I/O<8> correspond to the group G0, and the input/output line I/O<1> and an input/output line I/O<9> correspond to the group G1. Similarly, the input/output line I/O<2> and an input/output line I/O<10> correspond to the group G2, the input/output line I/O<3> and an input/output line I/O<11> correspond to the group G3, the input/output line I/O<4> and an input/output line I/O<12> correspond to the group G4, the input/output line I/O<5> and an input/output line I/O<13> correspond to the group G5, the input/output line I/O<6> and an input/output line I/O<14> correspond to the group G6, and the input/output line I/O<7> and an input/output line I/O<15> correspond to the group G7. FIG. 4 is an enlarged view showing a part of the group.

Figure 5:
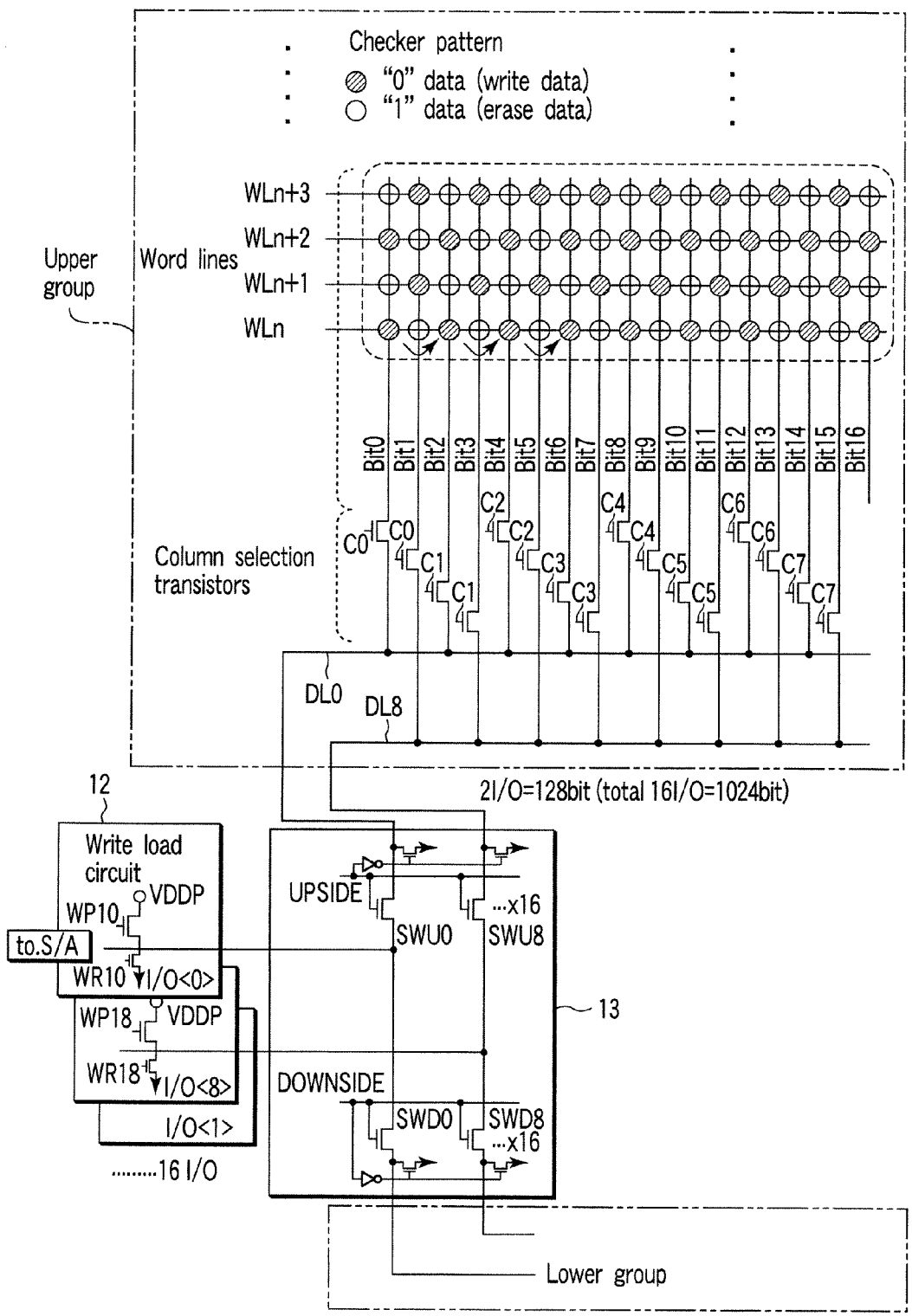
FIG. 5 is a view showing the memory cell configuration in the group, a checker pattern to be written in memory cells, and peripheral circuits.

FIG. 5 is a view showing the memory cell configuration in the group G0, a checker pattern to be written in the memory cells, and peripheral circuits.

FIG. 5 shows the checker pattern to be stored in the memory cells arranged in a matrix, and the arrangement of a bit line array. Although FIG. 5 shows only I/O<0> and I/O<8> as input/output lines, other input/output lines are also similarly arranged. As shown in FIG. 5, data lines (the input/output lines I/O) are separately allocated to even-numbered bit lines and odd-numbered bit lines. That is, a data line DL0 (the input/output line I/O<8>) is allocated to even-numbered bit lines, and a data line DL8 (the input/output line I/O<8>) is allocated to odd-numbered bit lines. When writing data in memory cells in this configuration, transistors SWU0 and SWU8 selected by a signal UPSIDE supply a high voltage output from the write load circuit 12 to the data lines DL0 and DL8 in the upper group. Reference symbol VDDP in FIG. 5 denotes a write power supply. The data lines DL0 and DL8 charge bit lines selected by column selection transistors C0 to C7. When writing a checker pattern, the pattern is written by using only even-numbered bit lines (bit lines 0, 2, 4, . . . ), i.e., only the data line DL0 with respect to an even-numbered word line WLn, and written by using only odd-numbered bit lines (bit lines 1, 3, 5, . . . ), i.e., only the data line DL8 with respect to an odd-numbered word line WLn+1. Note that the lower group has the same arrangement as the upper group.

Figure 6:
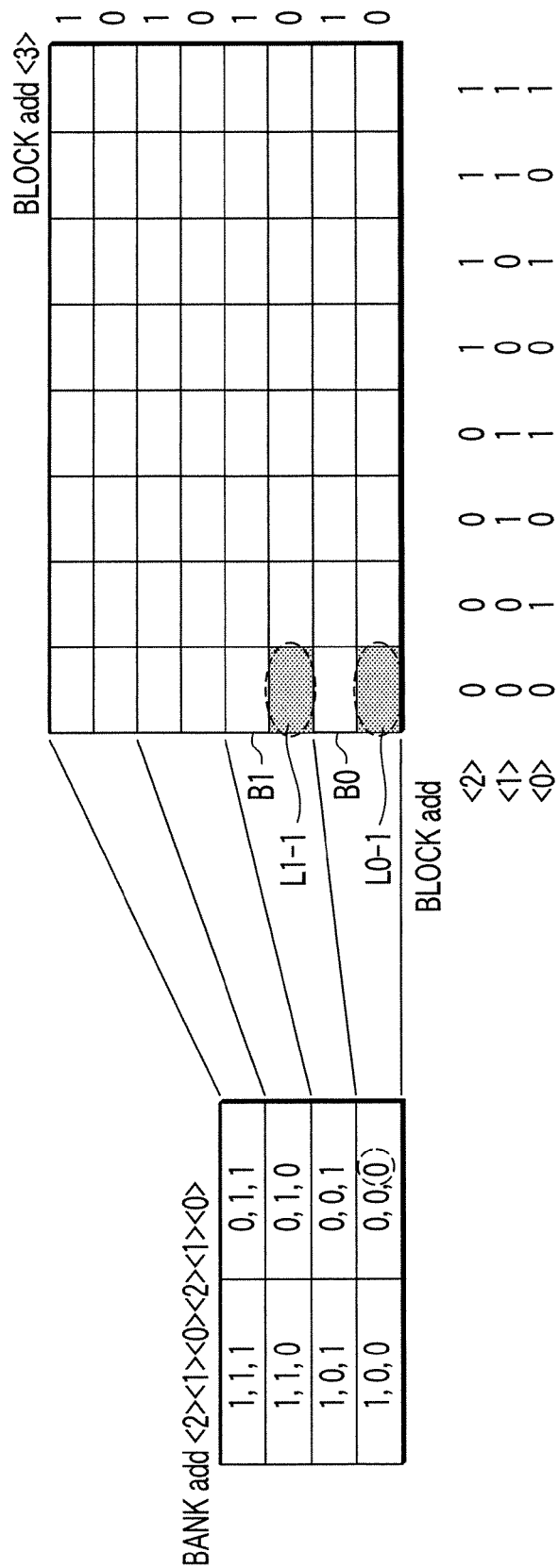
FIG. 6 is a view showing an address table of bank addresses and block addresses in the semiconductor memory device of the first embodiment.
Figures 7A, 7B:
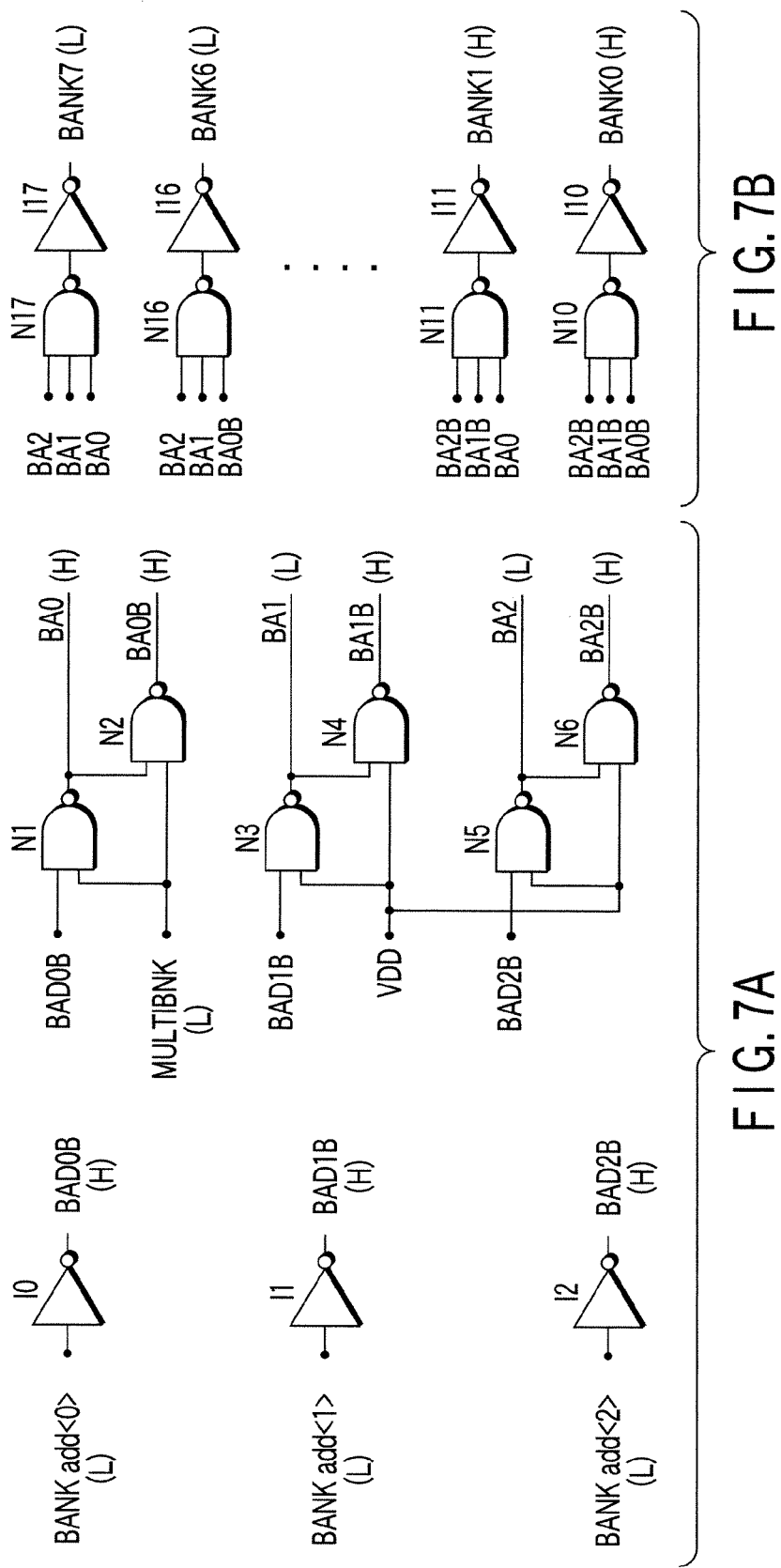
FIGS. 7A and 7B are circuit diagrams showing the arrangement of a bank decoder in the semiconductor memory device of the first embodiment.

FIG. 6 shows an address table of bank addresses (BANK add) and block addresses (BLOCK add) in the semiconductor memory device of the first embodiment. FIGS. 7A and 7B are circuit diagrams showing the arrangement of the bank decoder in the semiconductor memory device. This bank decoder has a bank address generator (FIG. 7A) that generates bank addresses BAn and BAnB (n is 0, 1, and 2) from bank addresses <n>, and a decoding result generator (FIG. 7B) that generates decoding results of "2$^n$" by decoding the bank addresses BAn and BAnB. Referring to FIGS. 7A and 7B, 0=L, and 1=H.

As shown in FIG. 7A, inverters I0, I1, and I2 receive the bank addresses <n>, and output signals BADnB. A NAND circuit N1 receives a signal BAD0B at the first input terminal, and a multi selection signal MULTIBNK at the second input terminal. The multi selection signal MULTIBNK designates simultaneous selection of two banks. The NAND circuit N1 outputs a signal BA0 from the output terminal, and a NAND circuit N2 receives the signal BA0 at the first input terminal. The NAND circuit N2 receives the multi selection signal MULTIBNK at the second input terminal, and outputs a signal BA0B from the output terminal.

A NAND circuit N3 receives a signal BAD1B at the first input terminal, and a power supply voltage VDD ("H") at the second input terminal. The NAND circuit N3 outputs a signal BA1 from the output terminal, and a NAND circuit N4 receives the signal BA1 at the first input terminal. The NAND circuit N4 receives the power supply voltage VDD at the second input terminal, and outputs a signal BA1B from the output terminal.

A NAND circuit N5 receives a signal BAD2B at the first input terminal, and the power supply voltage VDD at the second input terminal. The NAND circuit N5 outputs a signal BA2 from the output terminal, and a NAND circuit N6 receives the signal BA2 at the first input terminal. The NAND circuit N6 receives the power supply voltage VDD at the second input terminal, and outputs a signal BA2B from the output terminal.

As shown in FIG. 7B, the signals BA0, BA0B, BA1, BA1B, BA2, and BA2B output from the NAND circuits N1 to N6 are input to NAND circuits N10, N11, . . . , N16, and N17. The outputs from these NAND circuits are input to inverters I10, I11, . . . , I16, and I17. These inverters output bank selection signals BANK0 to BANK7.

The case that a block L0-1 in the bank B0 and a block L1-1 in the bank B1 are simultaneously selected will be described below as an example. When the bank addresses <2>, <1>, and <0> are (0,0,0), the banks B0 and B1 are simultaneously selected. When the bank selection signal is "H(1)", a bank having received this bank selection signal is selected. When the bank selection signal is "L(0)", a bank having received this bank selection signal is not selected.

When receiving (0,0,0) as the bank addresses <2>, <1>, and <0>, the inverters I0 to I2 output (1,1,1) as the signals BAD0B, BAD1B, and BAD2B. In addition, as shown in FIG. 7A, the NAND circuits N1, N3, and N5 receive the signals BAD0B, BAD1B, and BAD2B, multi selection signal MULTIBNK ("L"), and power supply voltage VDD ("H"), and output "H" as the signals BA0, BAD0B, BAD1B, and BAD2B, and "L" as the signals BA1 and BA2.

Furthermore, as shown in FIG. 7B, the NAND circuits N10 to N17 receive the signals BA0, BA0B, BA1, BA1B, BA2, and BA2B. That is, the NAND circuit N10 receives "H" as the signals BA0B, BA1B, and BA2B, and outputs "H" as the bank selection signal BANK0. Also, the NAND circuit N11 receives "H" as the signals BA0, BA1B, and BA2B, and outputs "H" as the bank selection signal BANK1. Since "L" is input as the signal MULTIBNK to the second input terminal of the NAND circuit N1 and the second input terminal of the NAND circuit N2, the signal BA0 as the output from the NAND circuit N1 is "H", and the signal BA0B as the output from the NAND circuit N2 is also "H". Accordingly, both the bank selection signals BANK0 and BANK1 are "H", so the banks B0 and B1 are selected at the same time.

After that, as shown in FIG. 6, on the basis of (0,0,0,0) input as the block addresses <3>, <2>, <1>, and <0>, the block L0-1 in the bank B0 and the block L1-1 in the bank B1 are simultaneously selected.

A checker pattern is written in the simultaneously selected blocks L0-1 and L1-1 in the banks B0 and B1 at the same time. That is, the checker pattern is written by 8 bits in the block L0-1 in the bank B0, and written by 8 bits in the block L1-1 in the bank B1 at the same time. This makes it possible to shorten the write time necessary to write the checker patterns.

Figure 8:
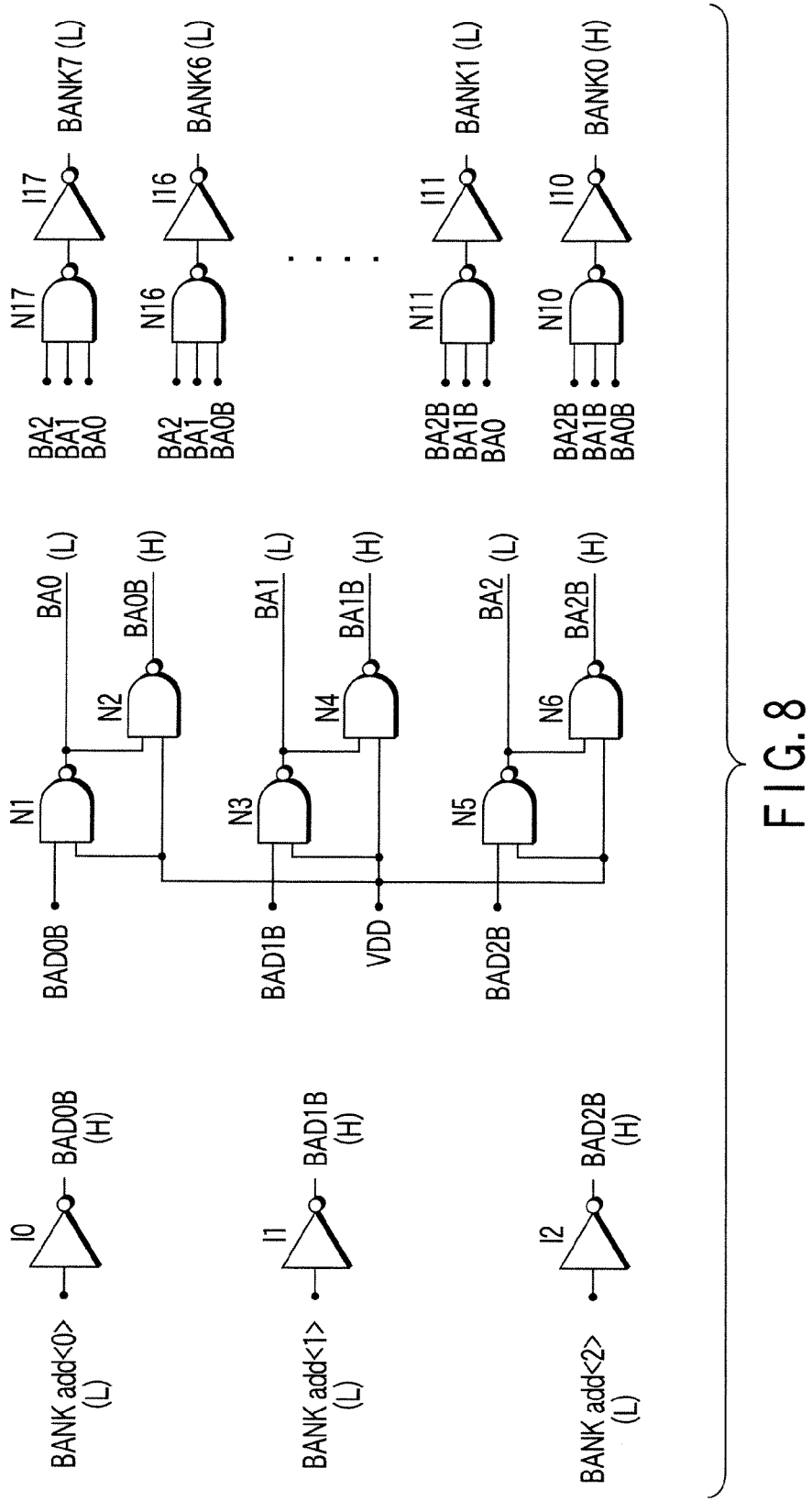
FIG. 8 is a circuit diagram showing the arrangement of a normally used bank decoder.

Note that FIG. 8 is a circuit diagram showing the arrangement of a normally used bank decoder. In FIG. 8, signals ("L") and ("H") indicate the case that the bank B0 is selected. In this bank decoder, "H" is input to the second input terminal of the NAND circuit N1 and the second input terminal of the NAND circuit N2. Therefore, the signal BA0 is "L", and the signal BA0B is "H". Consequently, only the bank selection signal BANK0 is "H", so the banks B0 and B1 are not simultaneously selected. In this case, a checker pattern is written in the bank B0 alone.

As explained above, the checker pattern is conventionally written by 8 bits in a block of one bank at the time of testing. However, the first embodiment can write the checker pattern by 16 bits by simultaneously writing it in a block in another bank selected by multi selection. As a consequence, the checker pattern write time can be reduced when conducting a test.

Second Embodiment

A semiconductor memory device of the second embodiment of the present invention will be explained below. The same reference numerals as in the first embodiment denote the same parts in the second embodiment. The first embodiment has disclosed the example in which two banks are simultaneously selected. The second embodiment will describe an example in which two blocks arranged in the Y direction (row direction) in the same bank are simultaneously selected.

Figure 9:
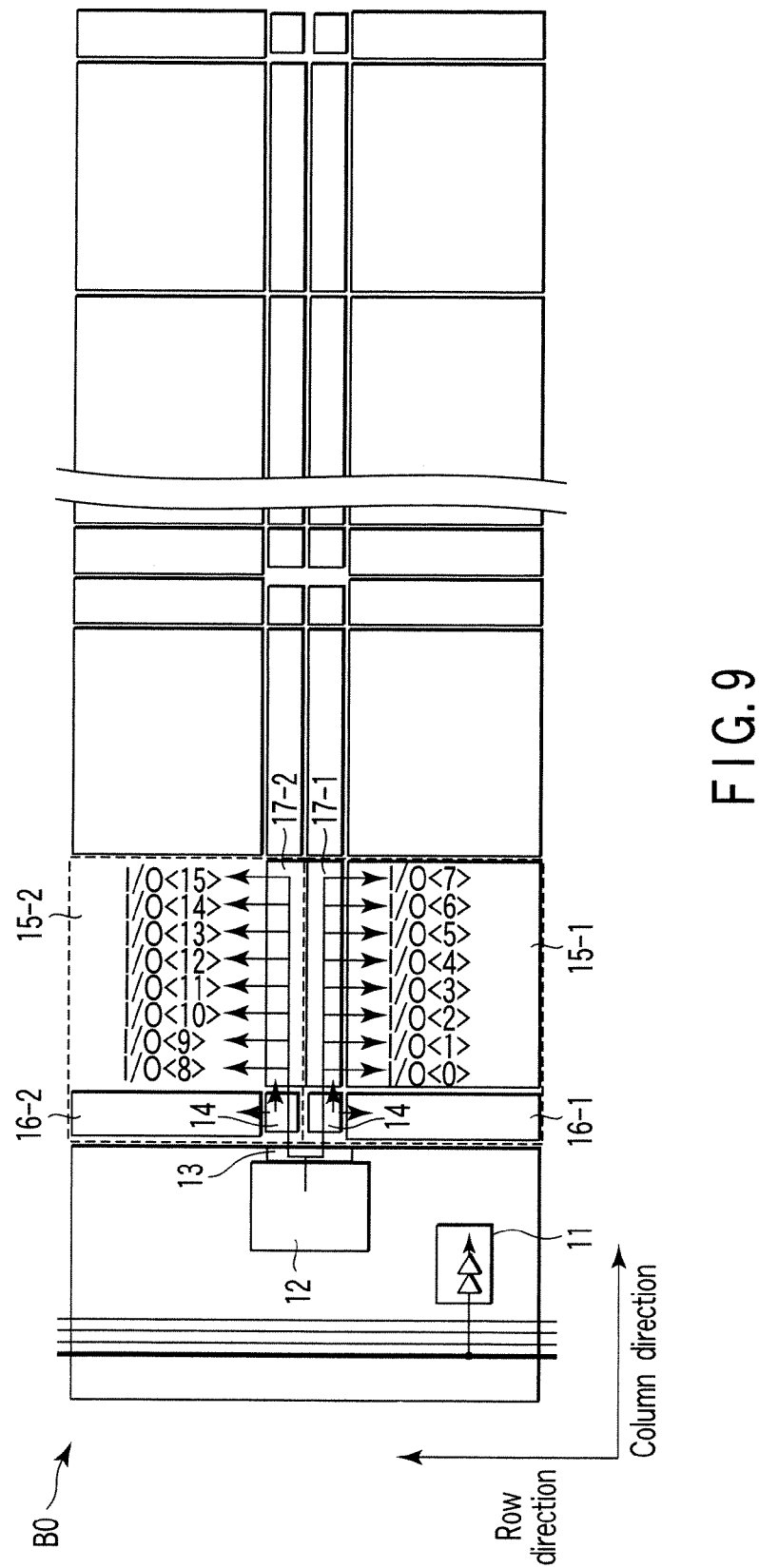
FIG. 9 is a view showing the internal arrangement of a bank in a semiconductor memory device of a second embodiment of the present invention.

FIG. 9 is a view showing the internal arrangement of a bank in the semiconductor memory device of the second embodiment of the present invention. As described previously, a bank B0 comprises a bank selector 11, a write load circuit 12, a switching circuit 13, block selectors 14, blocks 15-1 and 15-2, row decoders 16-1 and 16-2, and column selection transistor units 17-1 and 17-2.

The bank selector 11 receives a bank selection signal, and sets the bank B0 in an activated state or inactivated state on the basis of the bank selection signal. Of blocks arranged in the column direction into two, upper and lower stages in the bank, the switching circuit 13 selects the upside blocks or downside blocks. In other words, the switching circuit 13 selects low-order input/output lines I/O (low-order data lines) or high-order input/output lines I/O (high-order data lines). The input/output lines I/O selected by the switching circuit 13 receive a potential corresponding to write data, and the non-selected input/output lines I/O receive the ground potential. The block selectors 14 select the block 15-1 or 15-2 on the basis of a block address. The write load circuit 12 outputs a write voltage to the input/output lines I/O in the block selected by the block selectors 14.

Figure 10:
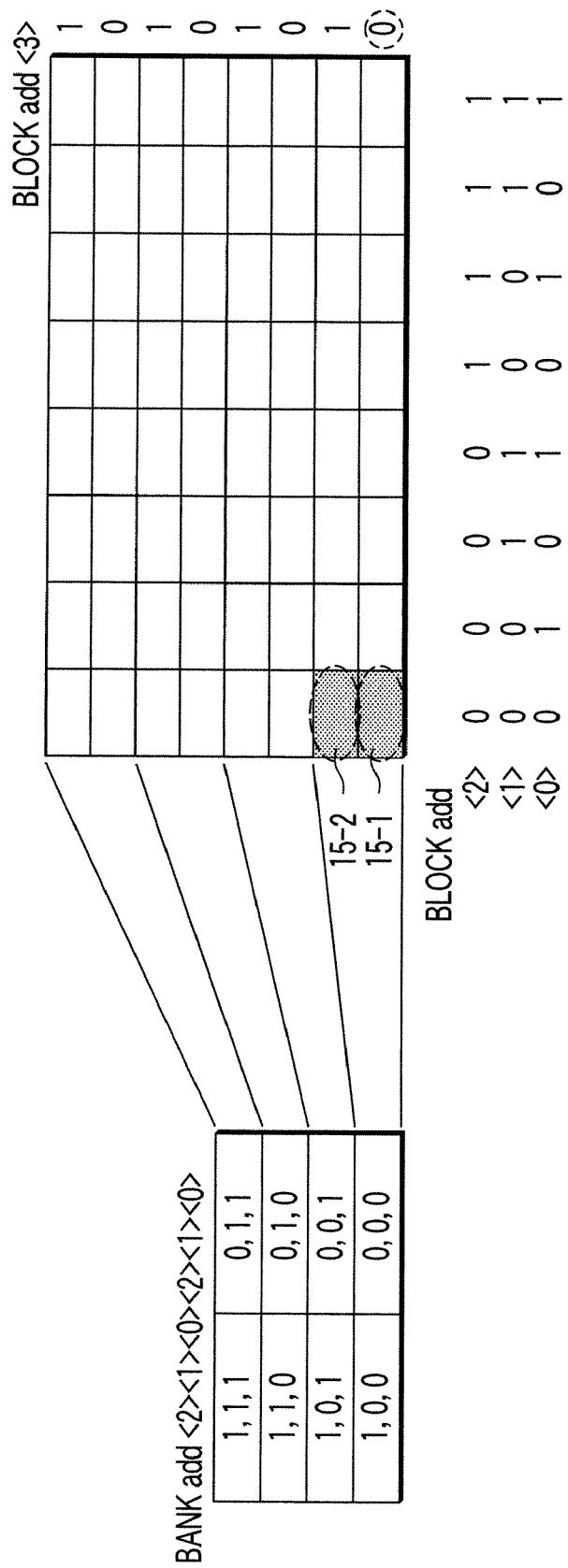
FIG. 10 is a view showing an address table of bank addresses and block addresses in the semiconductor memory device of the second embodiment.
Figure 11A:
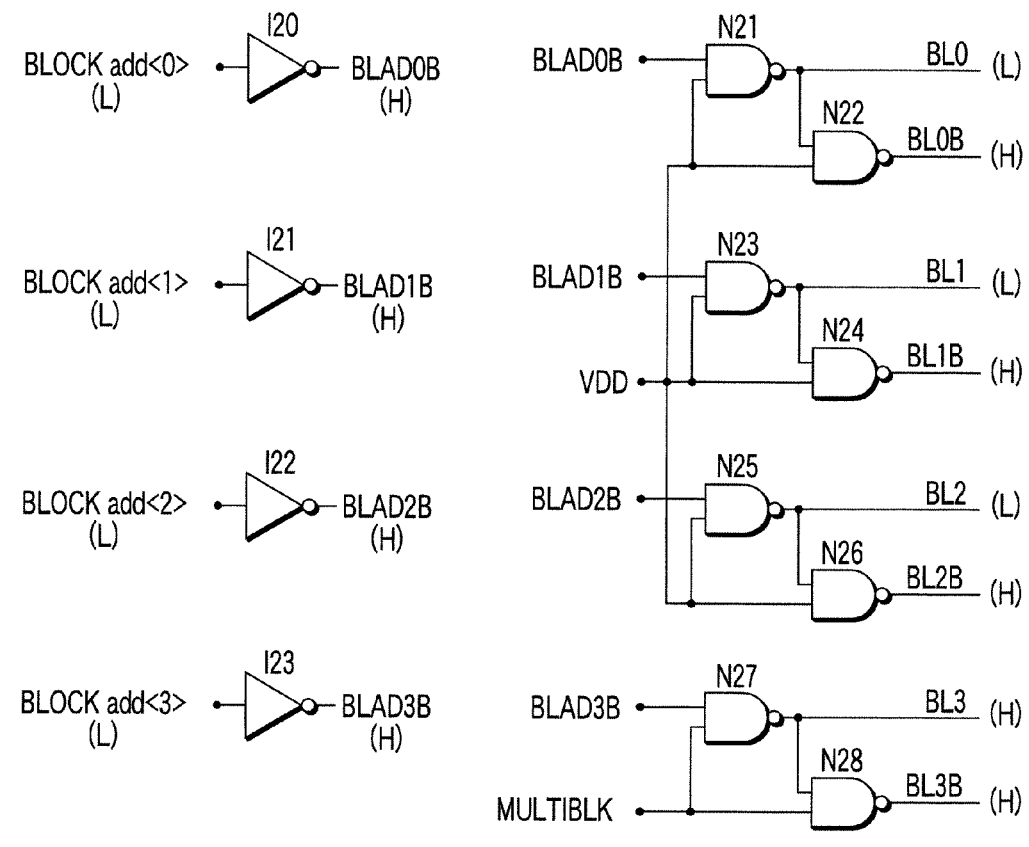
FIGS. 11A and 11B are circuit diagrams of a block decoder in the semiconductor memory device of the second embodiment.
Figure 11B:
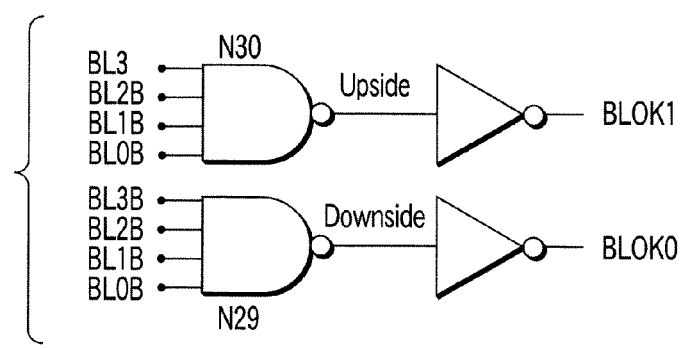

FIG. 10 shows an address table of bank addresses and block addresses in the semiconductor memory device of the second embodiment. FIG. 11A is a circuit diagram of a block selection decoder. FIG. 11B is a circuit diagram of a part of a block selector.

The case that the blocks 15-1 and 15-2 in the bank B0 are simultaneously selected will be described below. The bank decoder shown in FIGS. 7A and 7B receives (0,0,0) as bank addresses <2>, <1>, and <0>, and selects the bank B0. Note that a signal MULTIBNK is "H" in this case.

Then, as shown in FIG. 11A, inverters I20 to I23 receive (0,0,0,0) as block addresses <3>, <2>, <1>, and <0>, and output (1,1,1,1) as signals BLAD0B, BLAD1B, BLAD2B, and BLAD3B. NAND circuits N21, N23, N25, and N27 receive the signals BLAD0B, BLAD1B, BLAD2B, and BLAD3B, the multi selection signal MULTIBNK ("L"), and a power supply voltage VDD ("H"). Consequently, "H" is output as signals BL0B, BL1B, BL2B, BL3, and BL3B, and "L" is output as signals BL0, BL1, and BL2.

Subsequently, as shown in FIG. 11B, a NAND circuit N29 receives "H" as the signals BL0B, BL1B, BL2B, and BL3B, and outputs a block selection signal BLOK0 ("H"). Also, a NAND circuit N30 receives "H" as the signals BL0B, BL1B, BL2B, and BL3, and outputs a block selection signal BLOK1 ("H").

Since "L" is input as the signal MULTIBNK to the second input terminal of the NAND circuit N27 and the second input terminal of a NAND circuit N28, the signal BL3 as the output from the NAND circuit N27 is "H", and the signal BL3B as the output from the NAND circuit 28 is also "H". As a result, both the block selection signals BLOK0 and BLOK1 are "H", so the blocks 15-1 and 15-2 are simultaneously selected.

A checker pattern is written in the simultaneously selected blocks 15-1 and 15-2 in the bank B0 at the same time. That is, the checker pattern is written by 8 bits in the block 15-1 in the bank B0, and written by 8 bits in the block 15-2 in the same bank B0 at the same time. This makes it possible to shorten the write time necessary to write the checker pattern.

Figure 12:
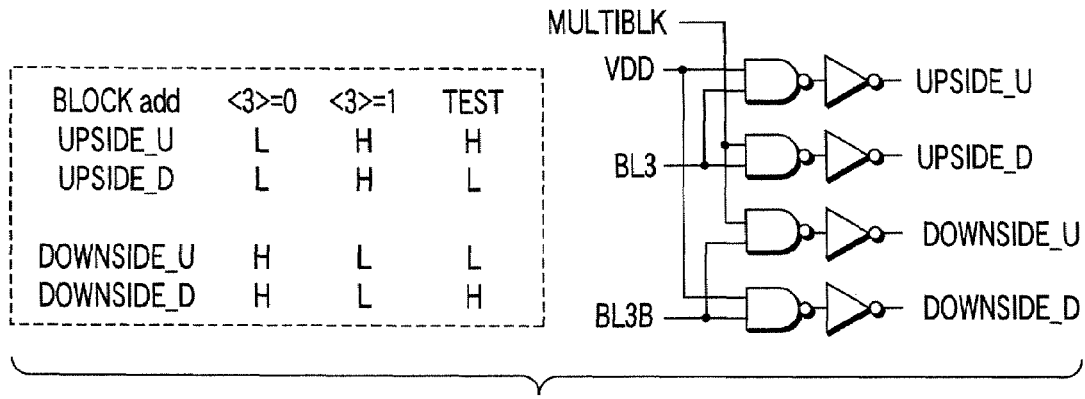
FIG. 12 is a circuit diagram of a switching decoder in the semiconductor memory device of the second embodiment.
Figure 13:
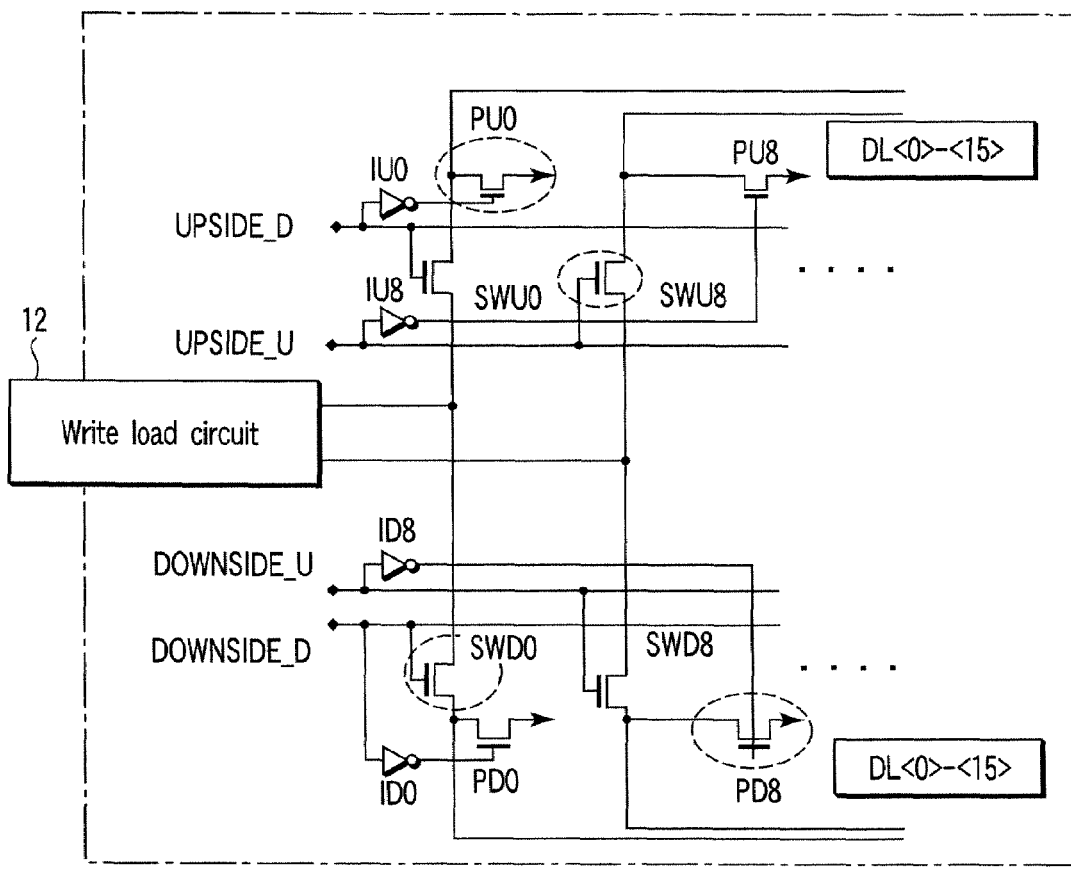
FIG. 13 is a circuit diagram of a switching circuit in the semiconductor memory device of the second embodiment.

FIG. 12 is a circuit diagram of a switching decoder that outputs a selection signal for selecting a block. FIG. 13 is a circuit diagram of a switching circuit for selecting a block in accordance with the selection signal.

The write load circuit 12 is connected to data input/output lines DL<0> to DL<15> via transistors SWD0 to SWD15. A pull-down transistor PD0 is connected between the transistor SWD0 and data input/output line DL<0>. A signal DOWNSIDE_D is input to the gate of the transistor SWD0, and the gate of the transistor PD0 via an inverter ID0. A pull-down transistor PD8 is connected between the transistor SWD8 and data input/output line DL<8>. A signal DOWNSIDE_U is input to the gate of the transistor SWD8, and the gate of the pull-down transistor PD8 via an inverter ID8.

Also, a pull-down transistor PU0 is connected between a transistor SWU0 and the data input/output line DL<0>. A signal UPSIDE_D is input to the gate of the transistor SWU0, and the gate of the transistor PU0 via an inverter IU0. A pull-down transistor PU8 is connected between a transistor SWU8 and the data input/output line DL<8>. A signal UPSIDE_U is input to the gate of the transistor SWU8, and the gate of the pull-down transistor PU8 via an inverter IU8.

In a normal operation as shown in FIG. 12, when the block address <3> is "L", the signals UPSIDE_U and UPSIDE_D are "L", and the signals DOWNSIDE_U and DOWNSIDE_D are "H". When the block address <3> is "H", the signals UPSIDE_U and UPSIDE_D are "H", and the signals DOWNSIDE_U and DOWNSIDE_D are "L". Consequently, the write voltage is supplied to the block 15-1 or 15-2. When conducting a test, the signal UPSIDE_U is "H", the signal UPSIDE_D is "L", the signal DOWNSIDE_U is "L", and the signal DOWNSIDE_D is "H". As a result, the write voltage is supplied to both the blocks 15-1 and 15-2.

In the circuit shown in FIG. 13, the same effect as in the first embodiment can be obtained even in the same bank by enabling the outputs from the write load circuit to the disabled high-order input/output lines I/O<8> to I/O<15>, thereby simultaneously selecting two blocks. Note that in this case, not a checker but a checker bar is written in memory cells in the blocks because the high-order input/output lines I/O<8> to I/O<15> are connected to odd-numbered bits.

A semiconductor memory device of a modification of the second embodiment will be explained below.

The second embodiment described above writes a checker bar in memory cells connected to odd-numbered bit lines. This modification inverts the low-order addresses of word lines to write a checker pattern even in these memory cells which are connected to odd-numbered bit lines and in which the checker bar is written.

Figure 14B:
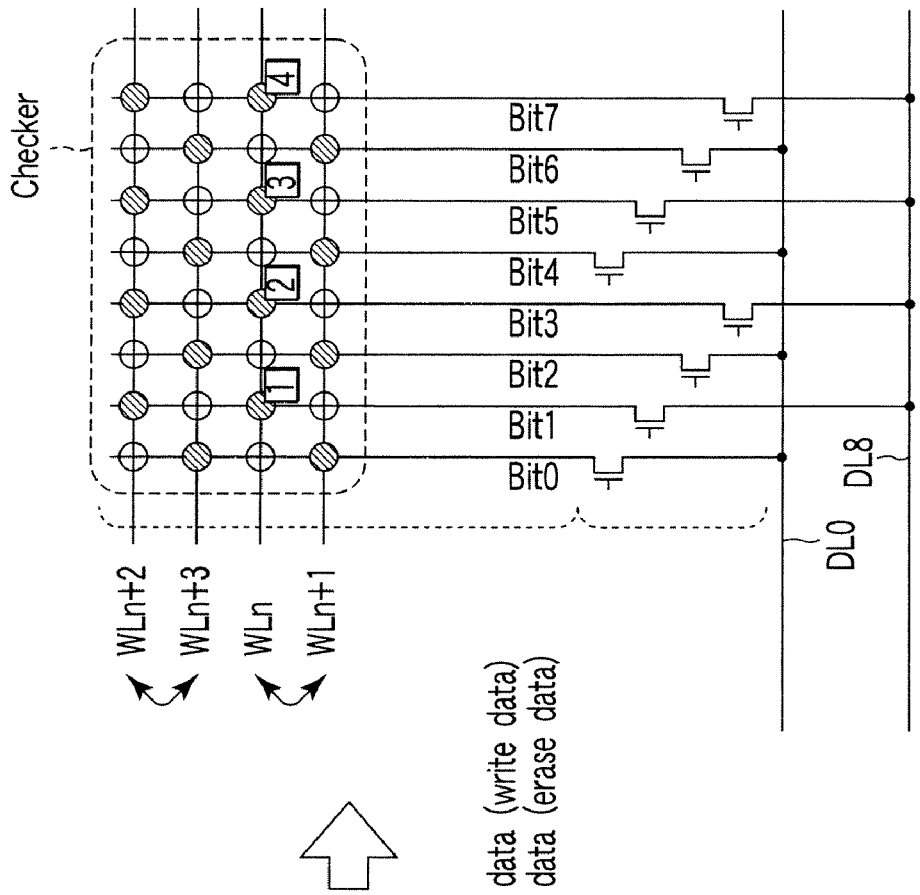
FIGS. 14A and 14B are views showing patterns to be written in a block of the semiconductor memory device of the second embodiment.
Figure 14A:
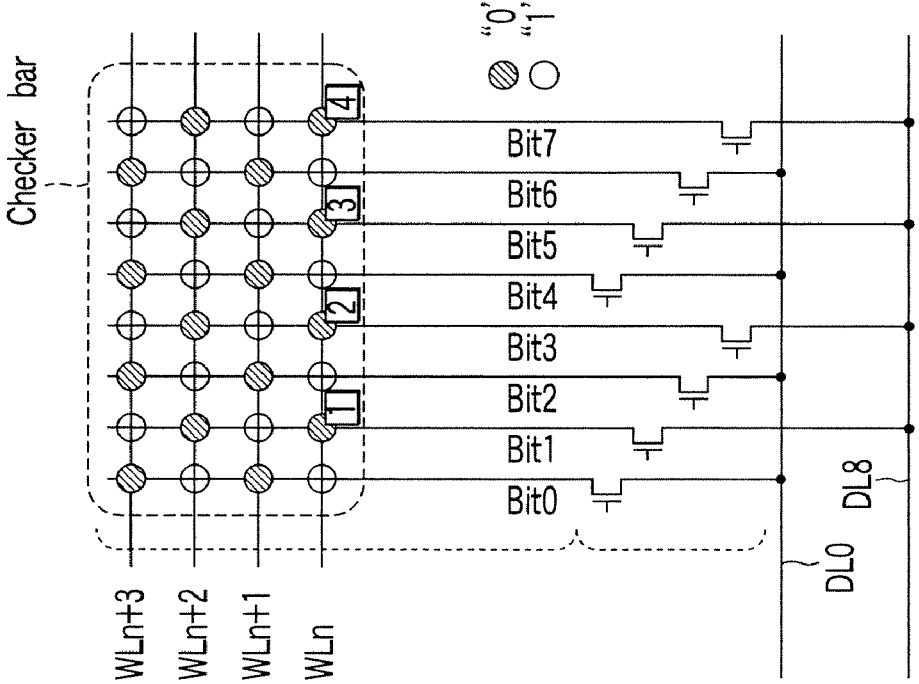

FIG. 14A is a view showing a checker bar pattern to be written in the block 15-2 of the second embodiment. FIG. 14B is a view showing a checker pattern to be written in the block 15-2 of the modification of the second embodiment. As shown in FIG. 14A, the checker bar pattern is written in memory cells. In the modification, however, as shown in FIG. 14B, the checker pattern is written in memory cells by inverting the addresses of word lines WLn and WLn+1.

Figures 15A, 15B:
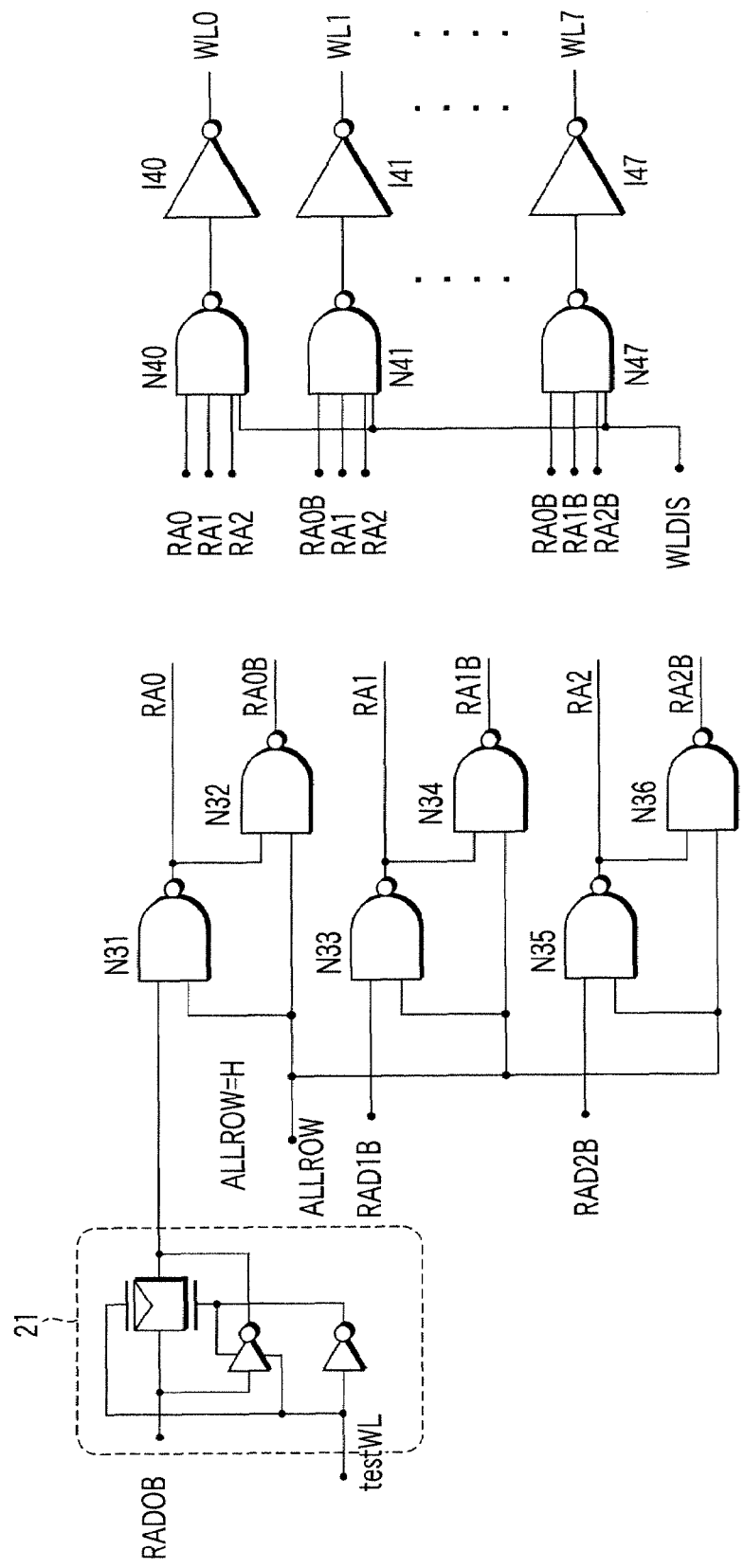
FIGS. 15A and 15B are circuit diagrams of a row decoder in the semiconductor memory device of the second embodiment.

FIGS. 15A and 15B are circuit diagrams showing a row decoder for inverting the word line addresses. This row decoder includes an address changing circuit 21 that is a circuit for changing the least significant address of a word line.

As shown in FIG. 15A, a NAND circuit N31 receives a row address RAD0B at the first input terminal via the address changing circuit 21, and receives a signal ALLROW at the second input terminal. The NAND circuit N31 outputs a signal RA0 from the output terminal, and a NAND circuit N32 receives the signal RA0 at the first input terminal. The NAND circuit N32 receives the signal ALLROW at the second input terminal, and outputs a signal RA0B from the output terminal.

A NAND circuit N33 receives a row address RAD1B at the first input terminal, and the signal ALLROW at the second input terminal. The NAND circuit N33 outputs a signal RA1 from the output terminal, and a NAND circuit N34 receives the signal RA1 at the first input terminal. The NAND circuit N34 receives the signal ALLROW at the second input terminal, and outputs a signal RA1B from the output terminal.

A NAND circuit N35 receives a row address RAD2B at the first input terminal, and the signal ALLROW at the second input terminal. The NAND circuit N35 outputs a signal RA2 from the output terminal, and a NAND circuit N36 receives the signal RA2 at the first input terminal. The NAND circuit N36 receives the signal ALLROW at the second input terminal, and outputs a signal RA2B from the output terminal.

As shown in FIG. 15B, a NAND circuit N40 receives the signals RA0, RA1, and RA2 and a word line disable signal WLD1S at the input terminals. The NAND circuit N40 outputs a signal to a word line WL0 via an inverter I40. A NAND circuit N41 receives the signals RA0B, RA1, and RA2 and the word line disable signal WLDIS at the input terminals. The NAND circuit N41 outputs a signal to a word line WL1 via an inverter I41. Output signals to word lines WL2 to WL6 are similarly formed. Furthermore, a NAND circuit N47 receives the signals RA0B, RA1B, and RA2B and the word line disable signal WLDIS at the input terminals. The NAND circuit N47 outputs a signal to a word line WL7 via an inverter I47.

In a normal operation, a signal testWL input to the address changing circuit 21 is "L", so the address changing circuit 21 directly outputs the input signal RAD0B to the NAND circuit N31. At the time of testing, the signal testWL is "H", so the address changing circuit 21 outputs an inverted signal of the input signal RAD0B to the NAND circuit N31.

The row decoder described above can invert the activation timings of the even-numbered word lines WLn and odd-numbered word lines WLn+1. Consequently, the checker bar pattern formed in memory cells of the block 15-2 can be changed to the checker pattern. The rest of the arrangement and the effect are the same as in the second embodiment.

Third Embodiment

A semiconductor memory device of the third embodiment of the present invention will be explained below. The same reference numerals as in the first embodiment denote the same parts in the third embodiment. The second embodiment has disclosed the example in which two blocks arranged in the Y direction (row direction) in the same bank are simultaneously selected. The third embodiment will describe an example in which two blocks arranged in the X direction (column direction) are simultaneously selected.

Figure 16:
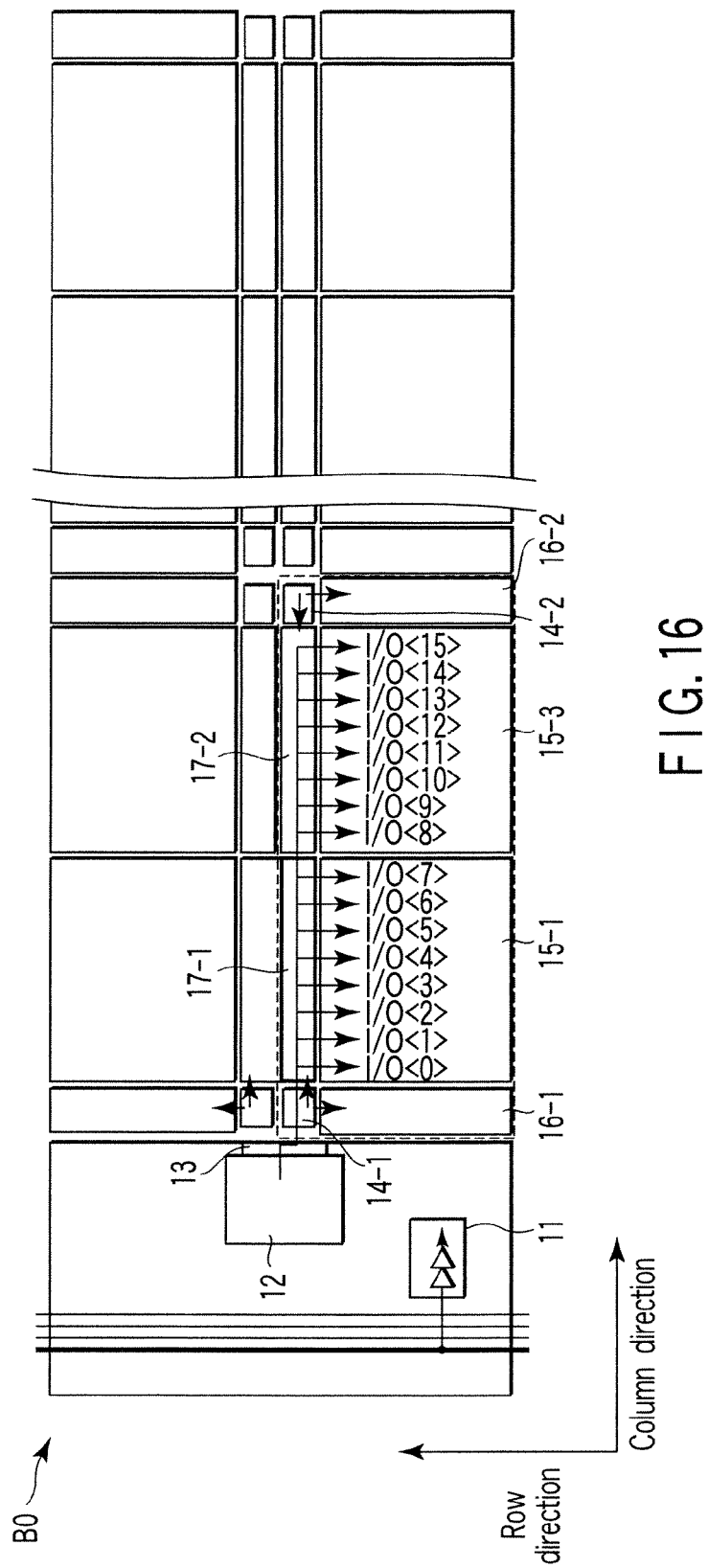
FIG. 16 is a view showing the internal arrangement of a bank in a semiconductor memory device of the third embodiment of the present invention.

FIG. 16 is a view showing the internal arrangement of a bank in the semiconductor memory device of the third embodiment of the present invention. As shown in FIG. 16, a bank B0 comprises a bank selector 11, a write load circuit 12, a switching circuit 13, block selectors 14-1 and 14-2, blocks 15-1 and 15-3, row decoders 16-1 and 16-2, and column selection transistor units 17-1 and 17-2. The block 15-1 includes low-order input/output lines I/O, and the block 15-3 includes high-order input/output lines I/O. The bank selector 11 sets the bank in an activated state or inactivated state on the basis of a bank selection signal. Of blocks arranged in the column direction into two, upper and lower stages in the bank, the switching circuit 13 selects the upside blocks or downside blocks. The block selectors 14-1 and 14-2 select the block 15-1 or 15-3 on the basis of a block address. The write load circuit 12 outputs a write voltage to input/output lines I/O in the block selected by the block selectors.

Figure 17:
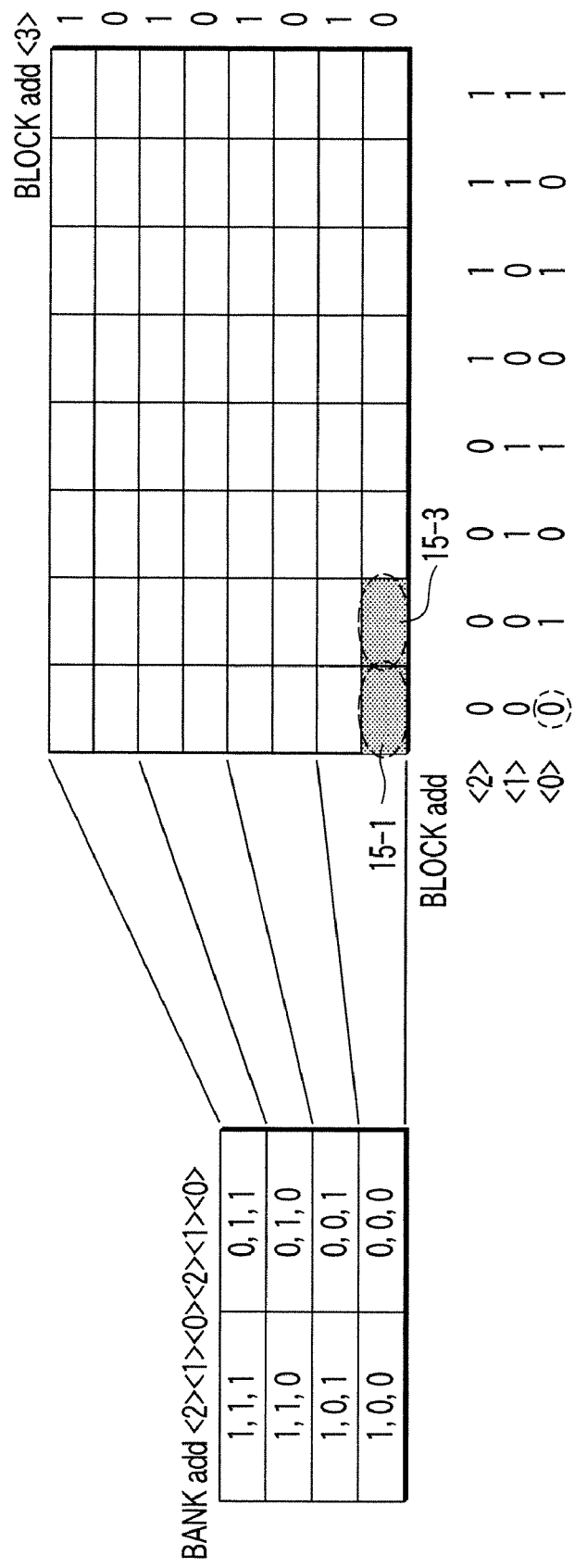
FIG. 17 is a view showing an address table of bank addresses and block addresses in the semiconductor memory device of the third embodiment.

A block selection decoder and block selectors are the same as in the second embodiment. FIG. 17 shows an address table of bank addresses and block addresses. The case that the blocks 15-1 and 15-3 in the bank B0 are simultaneously selected will be described below. First, a bank decoder selects the bank B0. After that, the block decoder is controlled so as to simultaneously select the blocks 15-1 and 15-3 when receiving (0,0,0,0) as block addresses <3>, <2>, <1>, and <0>.

A checker pattern is written in the simultaneously selected blocks 15-1 and 15-3 in the bank B0 at the same time. That is, the checker pattern is written by 8 bits in the block 15-1 of the bank B0, and written by 8 bits in the block 15-3 of the same bank B0 at the same time. This makes it possible to shorten the write time required to write the checker pattern.

Figure 18:
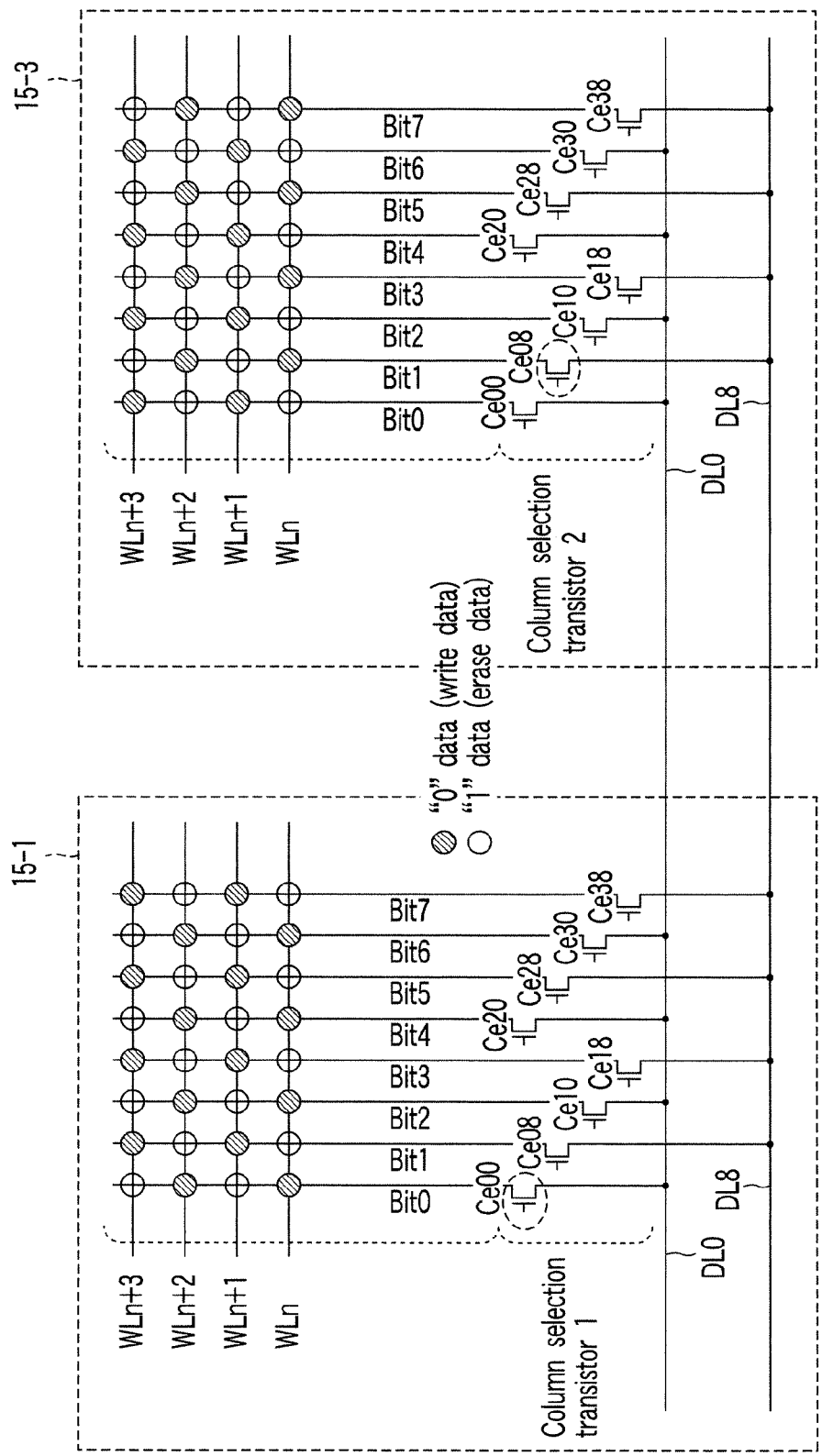
FIG. 18 is a view showing patterns to be written in blocks in the third embodiment.

FIG. 18 is a view showing patterns to be written in the blocks 15-1 and 15-3 in the third embodiment. A checker pattern is written in memory cells of the low-order block 15-1 by input/output lines I/O. A checker bar pattern is written in memory cells of the high-order block 15-3 by input/output lines I/O.

A semiconductor memory device of a modification of the third embodiment will be explained below.

The third embodiment described above writes the checker bar pattern in memory cells connected to odd-numbered bit lines. This modification inverts the low-order addresses of word lines to write the checker pattern even in these memory cells which are connected to odd-numbered bit lines and in which the checker bar is written.

Figure 19:
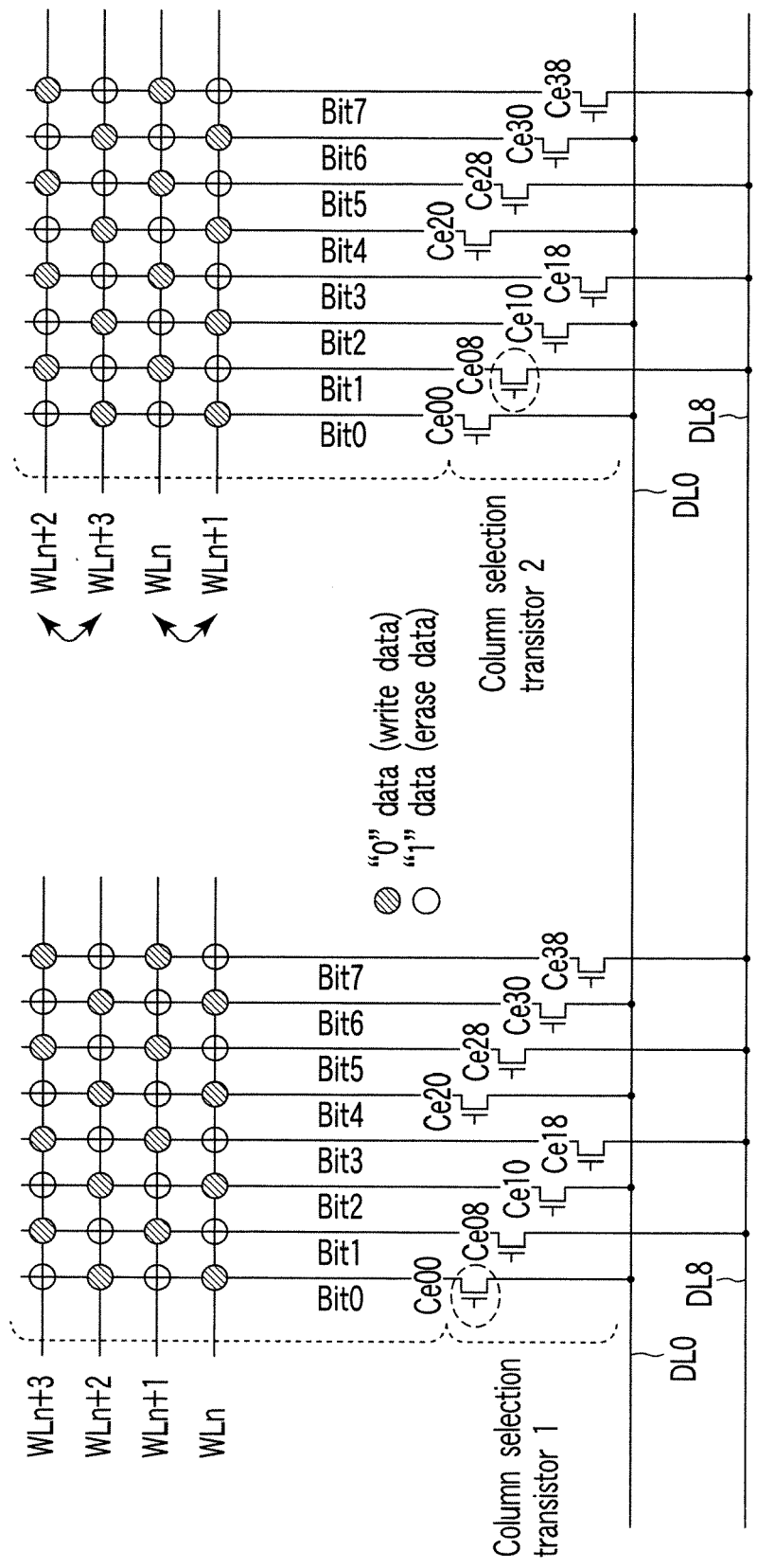
FIG. 19 is a view showing patterns to be written in blocks in a modification of the third embodiment.

As shown in FIG. 19, the checker bar pattern to be written in the high-order block 15-3 can be changed to the checker pattern by converting the row addresses by using the circuits shown in FIGS. 15A and 15B. More specifically, the checker bar pattern is changed into the checker pattern by exchanging the addresses of word lines WLn and WLn+1 (n=0, 2, 4, and 6).

As described previously, the checker pattern is conventionally written by 8 bits in one bank (block) at the time of testing. However, the above-mentioned embodiments can simultaneously write the checker pattern in a plurality of banks (blocks) selected by multi selection, thereby writing the checker pattern by, e.g., 16 bits. As a consequence, the checker pattern write time can be reduced.

The embodiments of the present invention can provide semiconductor memory devices capable of shortening the time necessary to write a pattern in memory cells when conducting a test.

These embodiments described above can be practiced singly or by appropriately combining them. Furthermore, the above embodiments include inventions in various stages. Therefore, these inventions in the various stages can also be extracted by appropriately combining the constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first bank including
      a first block in which a plurality of first memory cells are arranged in a matrix;
      a plurality of first bit lines connected to said plurality of first memory cells;
      a first data line connected to even-numbered bit lines of said plurality of first bit lines via a column selection transistor, and a second data line connected to odd-numbered bit lines of said plurality of first bit lines via a column selection transistor; and
      a first write load circuit which applies a first write voltage corresponding to write data to the first data line and the second data line at the time of data write,
   a second bank including
      a second block in which a plurality of second memory cells are arranged in a matrix;
      a plurality of second bit lines connected to said plurality of second memory cells;
      a third data line connected to even-numbered bit lines of said plurality of second bit lines via a column selection transistor, and a fourth data line connected to odd-numbered bit lines of said plurality of second bit lines via a column selection transistor; and
      a second write load circuit which applies a second write voltage corresponding to write data to the third data line and the fourth data line at the time of data write, and
   a bank decoder which selects a bank to be activated from the first bank and the second bank,
   wherein when testing operations of said plurality of first memory cells and said plurality of second memory cells, the bank decoder simultaneously selects the first bank and the second bank, and the first write load circuit and the second write load circuit simultaneously write data in memory cells in the first block and memory cells in the second block.

2. The device according to claim 1, wherein
   the bank decoder includes a bank address generator which generates a second bank address from a supplied first bank address, and a decoding result generator which generates a decoding result by decoding the second bank address, and the decoding result generator simultaneously outputs a signal which selects the first bank and a signal which selects the second bank.

3. The device according to claim 2, wherein the bank address generator receives a multi selection signal which designates simultaneous selection of the first bank and the second bank.

4. The device according to claim 1, further comprising:
a first block selector connected to the first write load circuit;
a second block selector connected to the second write load circuit;
a first input/output line formed in the first block; and
a second input/output line formed in the second block,
wherein the first write load circuit supplies the first write voltage to the first input/output line in the first block selected by the first block selector, and
the second write load circuit supplies the second write voltage to the second input/output line in the second block selected by the second block selector.

5. The device according to claim 1, further comprising:
a first row decoder which selects a word line connected to the memory cells in the first block;
a first column selection transistor which selects a bit line connected to the memory cells in the first block;
a second row decoder which selects a word line connected to the memory cells in the second block;
a second column selection transistor which selects a bit line connected to the memory cells in the second block.

6. The device according to claim 1, wherein the data written by the first write load circuit and the second write load circuit includes a checker pattern in which data are alternately inverted between adjacent memory cells.

7. The device according to claim 1, wherein the first bank and the second bank are minimum units for which data write or erase is simultaneously performed in parallel in a normal operation.

8. A semiconductor memory device comprising:
a first block in which a plurality of first memory cells are arranged in a matrix, the first block being formed in a bank;
a plurality of first bit lines connected to said plurality of first memory cells in the first block;
a second block in which a plurality of second memory cells are arranged in a matrix, the second block being formed in the bank;
a plurality of second bit lines connected to said plurality of second memory cells in the second block;
a first data line connected to even-numbered bit lines of said plurality of first bit lines and said plurality of second bit lines via a column selection transistor;
a second data line connected to odd-numbered bit lines of said plurality of first bit lines and said plurality of second bit lines via a column selection transistor;
a write load circuit which applies a write voltage corresponding to write data to the first data line and the second data line at the time of data write; and a block decoder which selects a block to be activated from the first block and the second block,
wherein when testing operations of said plurality of memory cells, the block decoder simultaneously selects the first block and the second block, and the write load circuit simultaneously writes data in memory cells in the first block and memory cells in the second block.

9. The device according to claim 8, wherein the first block and the second block are arranged along a direction in which said plurality of first bit lines and said plurality of second bit lines run.

10. The device according to claim 8, wherein the first block and the second block are arranged along a direction in which said plurality of first bit lines and said plurality of second bit lines are arrayed.

11. The device according to claim 8, wherein
the block decoder includes a block address generator which generates a second block address from a supplied first block address, and a decoding result generator which generates a decoding result by decoding the second block address, and
the decoding result generator simultaneously outputs a signal which selects the first block and a signal which selects the second block.

12. The device according to claim 11, wherein the block address generator receives a multi selection signal which designates simultaneous selection of the first block and the second block.

13. The device according to claim 8, further comprising a switching circuit which selects one of the first data line and the second data line,
wherein the write voltage is supplied to the data line selected by the switching circuit, and a ground potential is supplied to the non-selected data line.

14. The device according to claim 8, further comprising:
a plurality of word lines connected to said plurality of memory cells; and
a row decoder which selects the word line,
wherein a checker pattern in which data are alternately inverted between adjacent memory cells is written in memory cells in the first block, and a checker bar pattern which is a complementary pattern of the checker pattern is written in memory cells in the second block, and
the row decoder inverts a least significant address of the word line in accordance with a predetermined signal.

15. The device according to claim 8, further comprising:
a first row decoder which selects a word line connected to the memory cells in the first block;
a first column selection transistor which selects a bit line connected to the memory cells in the first block;
a second row decoder which selects a word line connected to the memory cells in the second block; and
a second column selection transistor which selects a bit line connected to the memory cells in the second block.

16. The device according to claim 8, wherein the data written by the write load circuit includes a checker pattern in which data are alternately inverted between adjacent memory cells.

* * * * *